(12) United States Patent
Shim (10) Patent No.: US 8,643,098 B2
(45) Date of Patent: Feb. 4, 2014

(54) METHOD FOR FABRICATING SEMICONDUCTOR DEVICE WITH SIDE CONTACT

(75) Inventor: Seung-Hyun Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 174 days.

(21) Appl. No.: 13/277,707

(22) Filed: Oct. 20, 2011

(65) Prior Publication Data

US 2012/0146221 A1 Jun. 14, 2012

(30) Foreign Application Priority Data

Dec. 8, 2010 (KR) ........................ 10-2010-0124878

(51) Int. Cl.
*H01L 29/66* (2006.01)

(52) U.S. Cl.
USPC .......... 257/331; 257/302; 257/329; 257/330; 257/332; 257/E21.41; 438/156; 438/262; 438/268; 438/597

(58) Field of Classification Search
USPC ............ 257/302, 329–332, E21.41; 438/156, 438/262, 268, 597
See application file for complete search history.

(56) References Cited

U.S. PATENT DOCUMENTS

2011/0298046 A1* 12/2011 Hong ............................ 257/331
2012/0007258 A1* 1/2012 Oh et al. ....................... 257/776

\* cited by examiner

*Primary Examiner* — Bac Au
(74) *Attorney, Agent, or Firm* — IP & T Group LLP (57) ABSTRACT

A semiconductor device includes an active region having a side contact region in a sidewall thereof, wherein the side contact has a bulb shape, an ohmic contact region formed over a surface of the side contact region, and a bitline connected to the active region through the ohmic contact.

12 Claims, 8 Drawing Sheets

METHOD FOR FABRICATING SEMICONDUCTOR DEVICE WITH SIDE CONTACT

CROSS-REFERENCE TO RELATED APPLICATIONS

The present application claims priority of Korean Patent Application No. 10-2010-0124878, filed on Dec. 8, 2010, which is incorporated herein by reference in its entirety.

BACKGROUND

1. Field

Exemplary embodiments of the present invention relate to a method for fabricating a semiconductor device, and more particularly, to a method for fabricating a semiconductor device with a side contact.

2. Description of the Related Art

A planar channel transistor has reached the physical limit in reducing a leakage current, an on-current, and a short channel effect, which are caused by the shrinkage in the size of a memory device, and thus it becomes more difficult to reduce the size of the memory device. Therefore, a vertical channel transistor has been developed. A buried bitline (BBL) having a metal layer is formed to make a cell with the vertical channel transistor. Since the buried bitline is connected to a part of a sidewall of an active region forming a vertical channel, a side contact is desired to be formed.

The cell of the memory device forms a bitline contact between a buried bitline including a metal layer and an active region. For the bitline contact, a contact open process of exposing one sidewall of an active region is performed. The bitline contact is formed by a side contact structure of exposing one sidewall of the active region.

Figure 1:
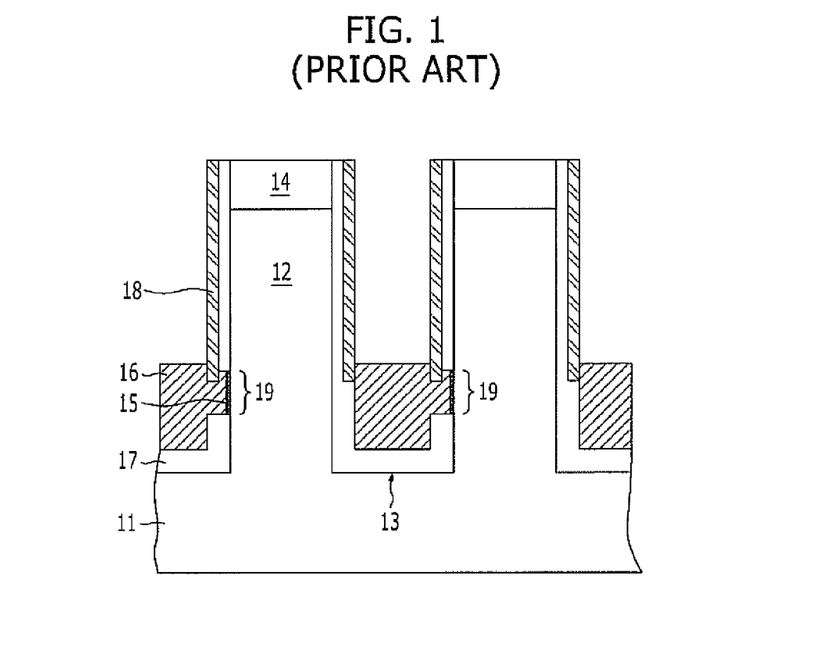
FIG. 1 is a diagram illustrating a semiconductor device in the conventional art.

FIG. 1 is a diagram illustrating a semiconductor device in the conventional art.

Referring to FIG. 1, a plurality of active regions 12 are formed on a substrate 11. The active regions 12 are separated by trenches 13 at a regular distance. A hard mask layer 14 is formed on the active regions 12. A buried bitline 16 is formed in the trench 13. The buried bitline 16 is electrically connected to a part of one sidewall of the active region 12. An ohmic contact region 15 is formed in an interface between the buried bitline 16 and the active region 12.

A contact process is performed in order to connect the buried bitline 16 to a part of one sidewall of the active region 12. This process will be referred to as one side contact (OSC) process. The OSC process is also called a 'side contact process'. A side contact region 19 is formed by etching a part of first and second liner layers 17 and 18.

However, in the conventional art, since the active region 12 has a high aspect ratio, it is difficult to form the side contact region 19 at a desired portion of the sidewall of the active region 12. Furthermore, it is difficult to ensure the uniformity and reproduction characteristics of the side contact region 19.

SUMMARY

An embodiment of the present invention is directed to a method for fabricating a semiconductor device, which is capable of easily and uniformly forming a side contact region for a connection between a buried bitline and an active region.

In accordance with an embodiment of the present invention, a semiconductor device includes: an active region having a side contact region in a sidewall thereof, wherein the side contact has a bulb shape; an ohmic contact region formed over a surface of the side contact region; and a bitline connected to the active region through the ohmic contact.

In accordance with another embodiment of the present invention, a semiconductor device includes: a plurality of active regions separated by a trench; side contact regions of a bulb shape formed on opposite sidewalls of the active regions adjacent to each other; ohmic contact regions formed over surfaces of the side contact regions; a separation layer dividing the trench; and a plurality of buried bit lines filled in the divided trench and connected to the active regions through the ohmic contact regions.

In accordance with further another embodiment of the present invention, a method for fabricating a semiconductor device includes: etching a substrate to form a plurality of active regions separated by a trench; forming side contact regions having a bulb shape over opposing sidewalls of adjacent ones of the active regions; forming ohmic contact regions over the side contact regions; forming buried bitlines connected to the active regions through the ohmic contact regions and filled in the trench; forming a separation trench that divides the buried bit lines; and forming a separation layer that fills the separation trench.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
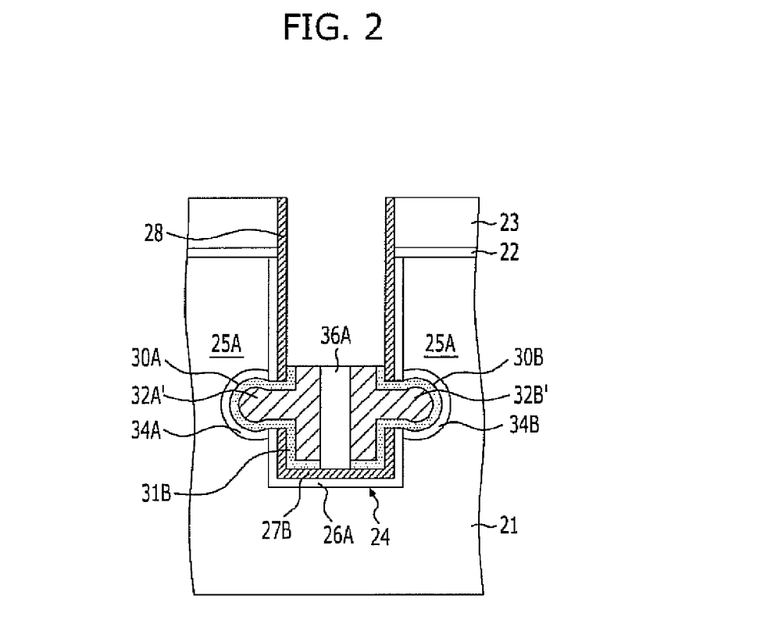
FIG. 2 is a diagram illustrating a semiconductor device in accordance with an embodiment of the present invention.

FIG. 2 is a diagram illustrating a semiconductor device in accordance with an embodiment of the present invention.

Referring to FIG. 2, a plurality of active regions 25A are formed on a substrate 21. The plurality of active regions 25A are separated by a trench 24. The active regions 25A have the same width. A pad pattern 22 and a hard mask pattern 23 are stacked on the active regions 25A.

An insulation layer is formed on the surface of the active regions 25A. The insulation layer includes a first liner layer 26A, a second liner layer 27B, and a third liner layer 28. The first liner layer 26A is formed on both sidewalls of the active region 25A and the surface of the substrate 21. The second liner layer 27B and the third liner layer 28 are formed on a part of the surface of the first liner layer 26A.

Side contact regions 30A and 30B are formed on sidewalls of the active region 25A between the second liner layer 27B and the third liner layer 28. Each of the side contact regions 30A and 30B has a bulb shape. The side contact regions 30A and 30B may be formed on opposite sidewalls of adjacent active regions 25A.

Two buried bitlines 32A' and 32B' filled in the trench 24 while being connected to the active regions 25A are formed. A separation layer 36A is formed between the two buried bitlines 32A' and 32B'. The separation layer 36A includes an insulation layer such as an oxide layer or a nitride layer.

A barrier layer 31B and an ohmic contact region 34A are formed between the buried bitline 32A' and the active region 25A, and the barrier layer 31B and an ohmic contact region 34B' are formed between the buried bitline 32B' and the active region 25A. The barrier layer 31B is formed by stacking a titanium layer and a titanium nitride layer. The ohmic contact regions 34A and 34B include titanium silicide.

As described above, in the semiconductor device in accordance with the embodiment of the present invention, the side contact regions 30A and 30B having a bulb shape are formed at a part of the opposite sidewalls of the active regions 25A separated by the trench 24 while being symmetrical to each other. The buried bitlines 32A' and 32B' are symmetrical to each other.

FIGS. 3A to 3H are cross-sectional views illustrating a method for fabricating the semiconductor device in accordance with the embodiment of the present invention.

Figure 3A:
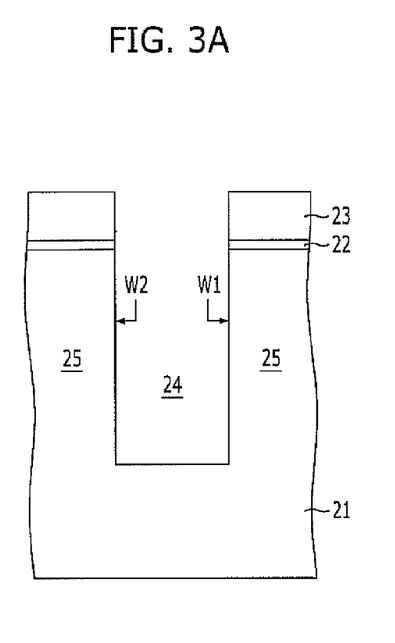
FIGS. 3A to 3H are cross-sectional views illustrating a method for fabricating a semiconductor device in accordance with an embodiment of the present invention.

Referring to FIG. 3A, a pad pattern 22 and a hard mask pattern 23 are formed on a substrate 21. The substrate 21 includes a silicon substrate. The pad pattern 22 includes an oxide layer and the hard mask pattern 23 includes a nitride layer. The hard mask pattern 23 may have a structure in which a nitride layer, an oxide layer, a carbon layer, and a silicon nitride layer (SiON) are sequentially stacked. The hard mask pattern 23 and the pad pattern 22 are formed using a photoresist pattern (not illustrated) as an etch barrier. The photoresist pattern may be patterned in a line-space type. The photoresist pattern is also called a buried bitline mask. After forming the pad pattern 22, the photoresist pattern is stripped.

The substrate 21 is etched by a predetermined depth using the hard mask pattern 23 as an etch barrier, so that a trench 24 is formed. A plurality of active regions 25 separated by the trench 24 are formed. As a result, the plurality of active regions 25 are formed on the substrate 21 and separated by the trench 24. The active region 25 includes a first sidewall W1 and a second sidewall W2.

The active region 25 may be a line pattern and the trench 24 may be a space pattern. The active regions 25 may have the same width.

As described above, the plurality of active regions 25 are separated by the trench 24.

As an etch process for forming the trench 24, an anisotropic etch process is used. Since the substrate 21 includes a silicon substrate, the anisotropic etch process may use $Cl_2$ or HBr gas alone, or include a plasma dry etch process using a mixture of these gases.

Figure 3B:
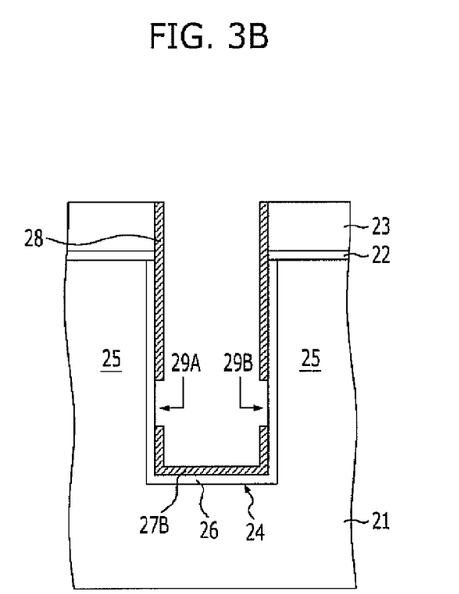

Referring to FIG. 3B, an insulation layer is formed on both sidewalls of the active region 25, the surface of the trench 24 between the active regions 25, and the sidewalls of the hard mask pattern 23. The insulation layer includes a first liner layer 26, a second liner layer 27B, and a third liner layer 28. The first liner layer 26 is formed on both sidewalls of the active regions 25 and the surface of the substrate 21. The second liner layer 27B and the third liner layer 28 are formed on a part of the surface of the first liner layer 26. The first liner layer 26 may include an oxide-based material while the second liner layer 27B and the third liner layer 28 may include a nitride-based material.

Contact regions 29A and 29B are formed between the second liner layer 27B and the third liner layer 28. The contact regions 29A and 29B expose a part of the first liner layer 26 formed on opposite sidewalls of the adjacent active regions 25. The contact regions 29A and 29B may have a line shape. That is, the contact regions 29A and 29B are in a line shape along the extension direction of the active regions 25.

A method for forming the contact regions 29A and 29B will be described later with reference to FIGS. 4A to 4E.

Figure 3C:
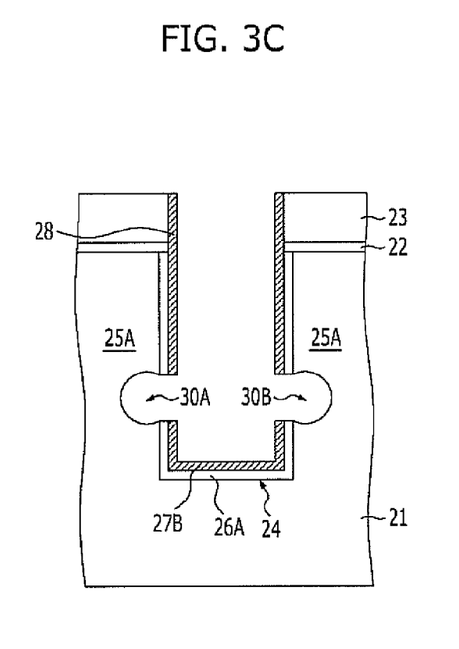

Referring to FIG. 3C, the first liner layer 26 exposed by the contact regions 29A and 29B, and the active regions 25 are etched. Hereinafter, the etched first liner layer 26 is indicated by reference numeral '26A' and the etched active regions 25 are indicated by reference numeral '25A'. Since the first liner layer 26A includes the oxide-based material, an HF or BOE solution is used.

The sidewalls of the active regions 25A are subject to an isotropic etch process, so that side contact regions are formed. The side contact regions include a first side contact region 30A and a second side contact region 30B. The first side contact region 30A is formed at a part of the sidewall of one of the adjacent active regions 25A, and the second side contact region 30B is formed at a part of the sidewall of the other one of the adjacent active regions 25A.

In this way, the first side contact region 30A and the second side contact region 30B are formed at the opposite sidewalls of the adjacent active regions 25A.

The first side contact region 30A and the second side contact region 30B have a bulb shape. To this end, an isotropic etch process is used. Since the active region 25A includes a silicon substrate, the isotropic etch process is performed with respect to silicon. In the isotropic etch process, the second liner layer 27B and the third liner layer 28, which include the nitride-based material, serve as an etch barrier.

For example, the isotropic etch process uses mixed gas of $N_2$, HBr, He and $Cl_2$. A side etching depth is increased by the isotropic etch process.

Figure 3D:
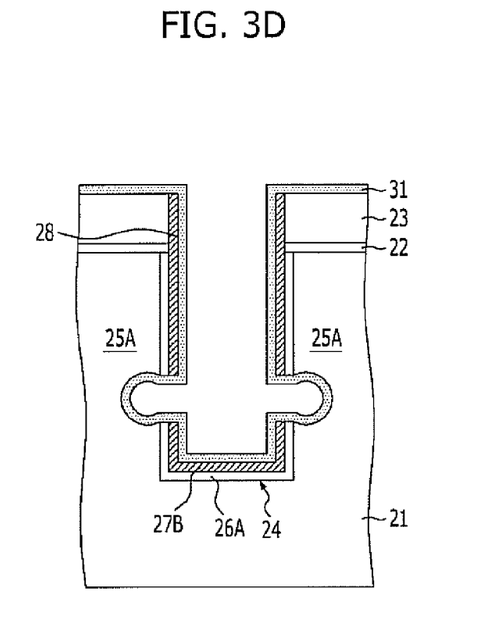

Referring to FIG. 3D, a barrier layer 31 is formed on a resultant structure including the first side contact region 30A and the second side region contact 30B. The barrier layer 31 includes a titanium-containing layer. For example, the barrier layer 31 includes a titanium (Ti) layer and a titanium nitride (TiN) layer. The barrier layer 31 is formed using a chemical vapor deposition (CVD) or atomic layer deposition (ALD) method. The barrier layer 31 may be formed by stacking the titanium layer and the titanium nitride layer (Ti/TiN).

The deposition area of the barrier layer 31 is increased by the bulb shape of the first side contact region 30A and the second side contact region 30B.

Figure 3E:
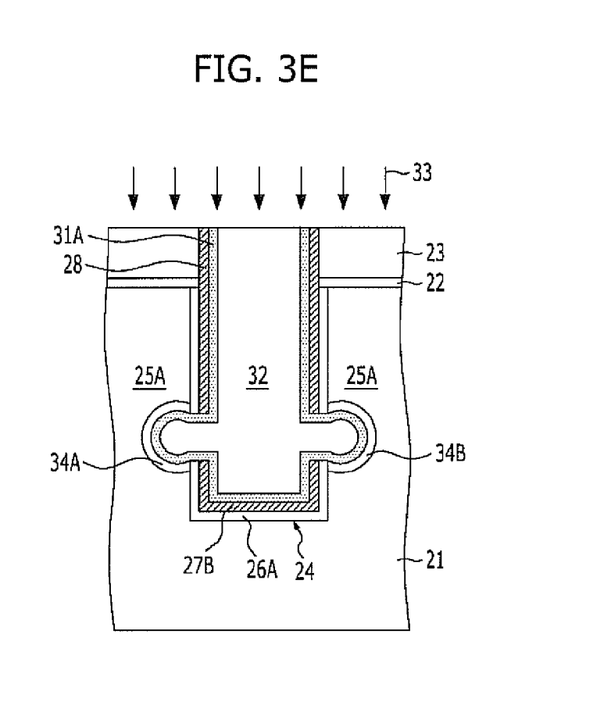

Referring to FIG. 3E, a doped layer 32 is formed on the barrier layer 31 until the trench 24 is gap-filled. The doped layer 32 is doped with dopant. For example, the doped layer 32 includes a doped polysilicon layer. The dopant doped in the doped layer 32 may include N-type dopant such as phosphorus (P). The doped layer 32 may be formed using a chemical vapor deposition (CVD) method.

The doped layer 32 is planarized until the surface of the hard mask pattern 23 is exposed. At this time, the barrier layer 31 formed over the hard mask pattern 23 and the third liner layer 28 is also etched. Hereinafter, the etched barrier layer 31 is indicated by reference numeral '31A'.

An annealing process 33 is performed. At this time, a silicide reaction occurs in a contact interface between the barrier layer 31A and the active region 25A, so that ohmic contact regions 34A and 34B are formed in an interface between the barrier layer 31A and the active region 25A. The ohmic contact regions 34A and 34B include titanium silicide.

Figure 3F:
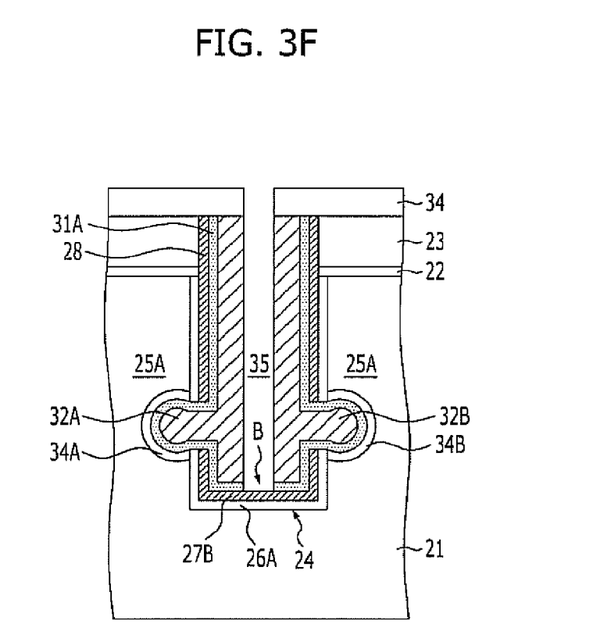

Referring to FIG. 3F, a bitline separation mask 34 is formed, and the doped layer 32 is etched using the bitline separation mask 34 as an etch barrier. Thus, a separation trench 35 is formed and buried bitlines are formed by the separation trench 35. The buried bitlines include a first buried bitline 32A and a second buried bitline 32B. The first buried bitline 32A and the second buried bitline 32B are separated by the separation trench 35. The first buried bitline 32A is electrically connected to one of the adjacent active regions 25A and the second buried bitline 32B is electrically connected to the other one of the adjacent active regions 25A. When forming the separation trench 35, the barrier layer 31A at the bottom of the trench is etched (refer to reference numeral 'B'). In this way, the adjacent buried bitlines 32A and 32B are electrically isolated from each other.

As described above, the first buried bitline 32A and the second buried bitline 32B are connected to the adjacent active regions 25A, respectively.

In another embodiment, the doped layer may be removed, the trench may be filled with a metal layer including tungsten and the like, and a bitline separation mask and etch process may be performed. Thus, the first buried bitline 32A and the second buried bitline 32B include the metal layer.

Figure 3G:
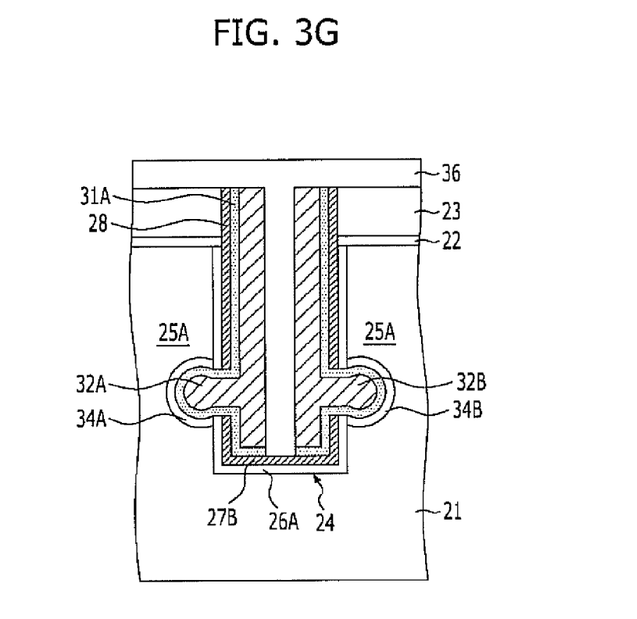

Referring to FIG. 3G, the bitline separation mask 34 is removed and a separation layer 36 is filled in the separation trench 35. The separation layer 36 includes an oxide layer and a nitride layer. The trench 24 is divided into two trenches by the separation layer 36.

In this way, a pair of buried bitlines including the first buried bitline 32A and the second buried bitline 32B is formed in the trench 24. The pair of buried bitlines are separated by the separation layer 36.

Figure 3H:
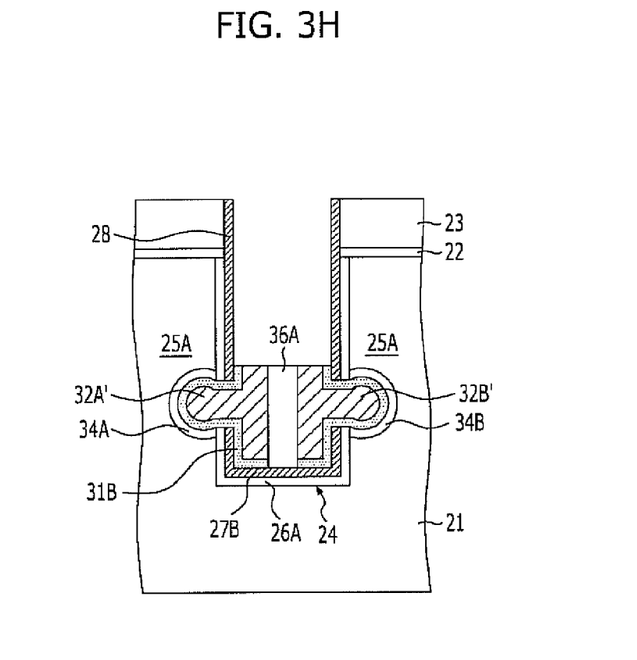

Referring to FIG. 3H, the first buried bitline 32A and the second buried bitline 32B are recessed by a predetermined depth using an etch-back process. Hereinafter, the recessed first buried bitline 32A is indicated by reference numeral '32A'', and the recessed second buried bitline 32B is indicated by reference numeral '32B''. Thus, the first buried bitline 32A' and the second buried bitline 32B' partially fill the trench 24. When the first buried bitline 32A and the second buried bitline 32B are recessed, the barrier layer 31A and the separation layer 36 are also recessed. Hereinafter, the recessed barrier layer 31A is indicated by reference numeral '31B', and the recessed separation layer 36 is indicated by reference numeral '36A'. As a result, the separation layer 36A remains between the first buried bitline 32A' and the second buried bitline 32B'.

FIGS. 4A to 4E are diagrams illustrating an example of a method for forming a contact region according to the embodiment of the present invention.

Figure 4A:
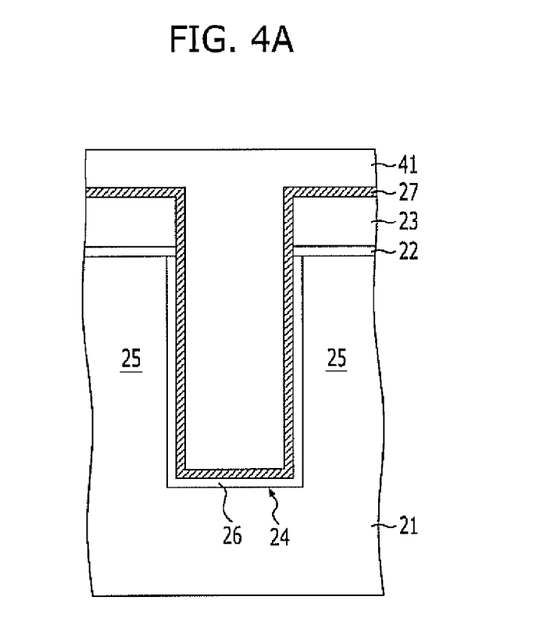
FIGS. 4A to 4E are diagrams illustrating an example of a method for forming a contact region according to an embodiment of the present invention.

Referring to FIG. 4A, the first liner layer 26 is formed on the sidewalls and a bottom of the active regions 25. The first liner layer 26 includes an oxide layer. The first liner layer 26 is formed through a wall oxidation process. In another embodiment, the first liner layer 26 may also be formed on the entire surface of the substrate 21 using a deposition method such as a chemical vapor deposition method.

The second liner layer 27 is formed on a resultant structure including the first liner layer 26. The second liner layer 27 includes a nitride layer such as a silicon nitride layer. The second liner layer 27 may be formed using a deposition method such as a chemical vapor deposition method.

A first sacrificial layer 41 is formed on the second liner layer 27 to gap-fill the trench 24. The first sacrificial layer 41 is removed after a subsequent process is performed. For example, the first sacrificial layer 41 includes undoped polysilicon. Using the undoped polysilicon, excellent gap-fill characteristics for the trench 24 are achieved.

Figure 4B:
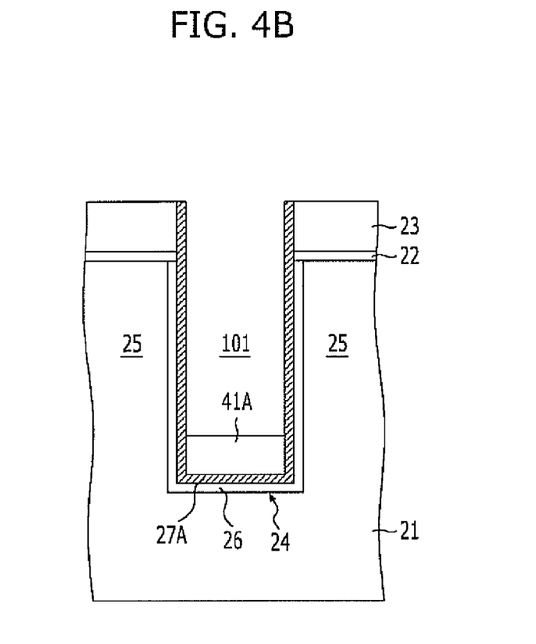

Referring to FIG. 4B, the first sacrificial layer 41 is planarized using a chemical mechanical polishing (CMP) process. The chemical mechanical polishing process is performed until the hard mask pattern 23 is exposed. Thus, in the chemical mechanical polishing process, the second liner layer 27 on the hard mask pattern 23 is also removed. Hereinafter, the etched second liner layer 27 is indicated by reference numeral '27A'.

The first sacrificial layer 41 is recessed by a predetermined depth, resulting in the formation of a first recess region 101 in the trench 24, in which a first sacrificial pattern 41A of a predetermined height remains. In order to form the first sacrificial pattern 41A, a wet etch process may be used.

Figure 4C:
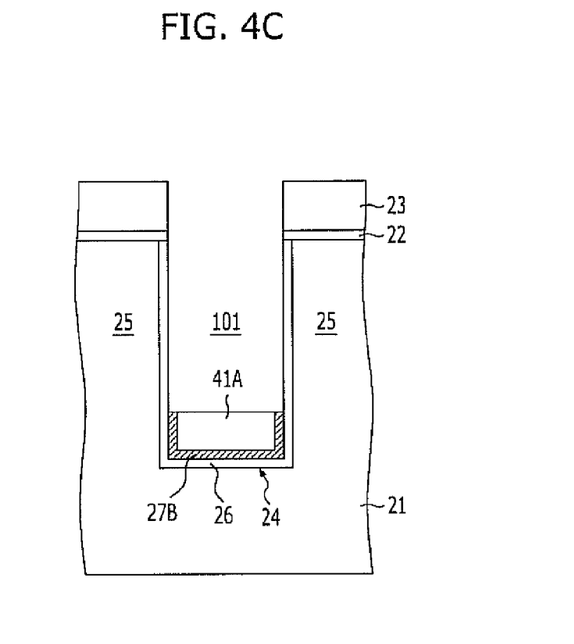

Referring to FIG. 4C, the second liner layer 27A exposed by the first recess region 101 is removed, so that a second liner layer 27B remains with substantially the same height as that of the first sacrificial pattern 41A. In order to selectively remove the second liner layer 27A, a wet etch process may be used.

Figure 4D:
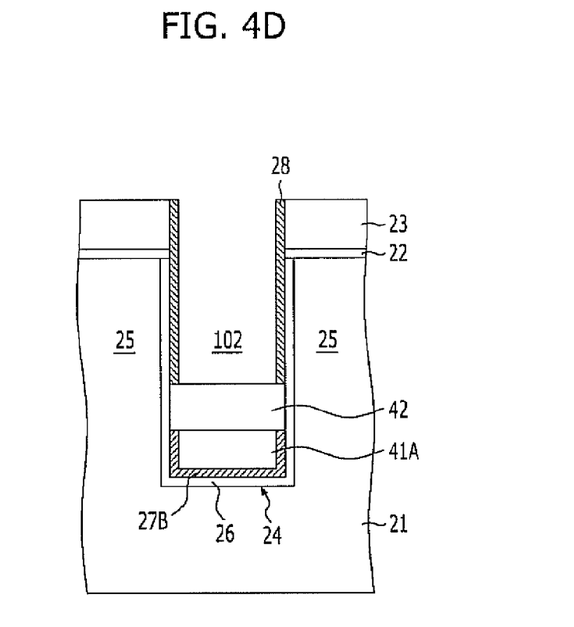

Referring to FIG. 4D, a second sacrificial pattern 42 is formed. The second sacrificial pattern 42 is formed on the first sacrificial pattern 41A in the trench 24 while substantially having a predetermined height. A second recess region 102 is formed on the second sacrificial pattern 42. In order to form the second sacrificial pattern 42, an undoped polysilicon layer is formed until the first recess 101 on the first sacrificial pattern 41A is gap-filled, and an etch-back process performed. The second sacrificial pattern 42 and the first sacrificial pattern 41A include an undoped polysilicon layer.

The third liner layer 28 is formed on a resultant structure including the second sacrificial pattern 42. The third liner layer 28 includes a nitride layer such as a silicon nitride layer. The third liner layer 28 is selectively etched. Thus, the third liner layer 28 remains in the form of a spacer.

Figure 4E:
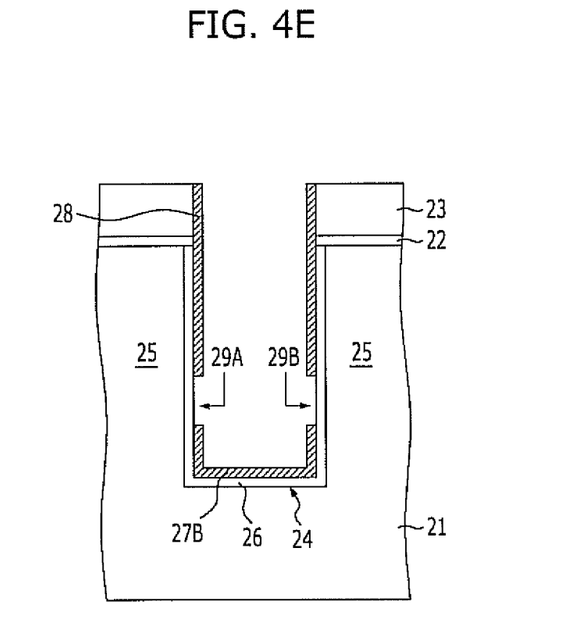

Referring to FIG. 4E, the second sacrificial pattern 42 and the first sacrificial pattern 41A are selectively removed. Thus, the contact regions 29A and 29B are formed between the second liner layer 27B and the third liner layer 28. The contact regions 29A and 29B expose a part of the first liner layer 26 formed on the opposite sidewalls of the adjacent active regions 25A.

In accordance with the embodiment of the present invention, side contact regions are simultaneously formed at opposite sidewalls of adjacent active regions, so as to be formed with uniform depth and position.

Furthermore, since the side contact regions are formed by recessing liner layers and sacrificial layers, the level of difficulty of processes can be reduced and a margin of a mask process can be ensured. Consequently, the side contact regions can be uniformly formed.

In addition, the side contact regions are formed in a bulb shape, so that contact materials can be formed in a wider area.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of active regions separated by a trench;
   side contact regions of a bulb shape formed on opposite sidewalls of the active regions adjacent to each other;
   ohmic contact regions formed over surfaces of the side contact regions;
   a separation layer dividing the trench; and
   a plurality of buried bit lines filled in the divided trench and connected to the active regions through the ohmic contact regions.

2. The semiconductor device of claim 1, wherein the ohmic contact region includes metal silicide.

3. The semiconductor device of claim 1, wherein the buried bitline includes a metal or polysilicon.

4. The semiconductor device of claim 1, wherein the separation layer includes an insulation layer.

5. The semiconductor device of claim 1, further comprising:
   a liner layer formed over sidewalls of the active regions other than a part of each sidewall in which the respective side contact region is formed and a bottom of the trench to insulate the buried bitlines from the active regions.

6. A method for fabricating a semiconductor device, comprising:
   etching a substrate to form a plurality of active regions separated by a trench;
   forming side contact regions having a bulb shape over opposing sidewalls of adjacent ones of the active regions;
   forming ohmic contact regions over the side contact regions;
   forming buried bitlines connected to the active regions through the ohmic contact regions and filled in the trench;
   forming a separation trench that divides the buried bit lines; and
   forming a separation layer that fills the separation trench.

7. The method of claim 6, wherein, in the forming of the side contact regions having the bulb shape, the side contact regions are formed by isotropically etching the opposite sidewalls of the active regions.

8. The method of claim 6, wherein the forming of the ohmic contact regions comprises:
   forming a titanium nitride of barrier layer over a resultant structure including the side contact regions;
   forming a doped polysilicon layer over the barrier layer to gap-fill the trench; and
   performing an annealing process.

9. The method of claim 6, wherein the forming of the side contact regions having the bulb shape comprises:
   forming a first liner layer that covers the active regions and a surface of the trench;
   forming a second liner layer over the first liner layer;
   forming a first sacrificial layer over the second liner layer to gap-fill the trench;
   forming a first recess region by recessing the first sacrificial layer by a first depth;
   removing the second liner layer exposed by the first recess region;
   forming a second sacrificial layer that gap-fills the first recess region;
   forming a second recess region by recessing the second sacrificial layer by a second depth;
   forming a third liner layer that covers a surface of the first liner layer;
   removing the second sacrificial layer and the first sacrificial layer;
   simultaneously exposing a part of the opposite sidewalls of the active regions by selectively removing the first liner layer exposed between the third liner layer and the second liner layer; and
   isotropically etching the exposed sidewalls.

10. The method of claim 9, wherein the second liner layer and the third liner layer include a nitride layer and the first liner layer includes an oxide layer.

11. The method of claim 10, wherein the first liner layer exposed between the third liner layer and the second liner layer is selectively removed by using an HF or BOE solution.

12. The method of claim 9, wherein the isotropically etching of the exposed sidewalls is performed by using a gas selected from the group consisting of $N_2$, HBr, He and $Cl_2$ or a mixed gas thereof.

* * * * *